(12) United States Patent
Ding et al.

(10) Patent No.: US 7,324,025 B1
(45) Date of Patent: Jan. 29, 2008

(54) NON-INTEGER INTERPOLATION USING CASCADED INTEGRATOR-COMB FILTER

(75) Inventors: Lei Ding, Austin, TX (US); John L. Melanson, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/528,805

(22) Filed: Sep. 28, 2006

(51) Int. Cl.
*H03M 7/00* (2006.01)

(52) U.S. Cl. .......................................... 341/61; 341/118

(58) Field of Classification Search .................. 341/61, 341/118, 117, 144, 155; 375/354, 350; 708/300; 342/149; 370/545
See application file for complete search history.

(56) References Cited

U.S. PATENT DOCUMENTS

| | | | | |
|---|---|---|---|---|
| 5,049,888 | A * | 9/1991 | Prenat | 342/149 |
| 5,513,209 | A * | 4/1996 | Holm | 375/354 |
| 5,592,517 | A * | 1/1997 | Camp et al. | 375/350 |
| 6,208,671 | B1 * | 3/2001 | Paulos et al. | 370/545 |
| 6,795,007 | B2 * | 9/2004 | Mayes | 341/143 |
| 2004/0148319 | A1 * | 7/2004 | Bossmeyer et al. | 708/200 |
| 2005/0160124 | A1 * | 7/2005 | Bisiaux | 708/300 |

OTHER PUBLICATIONS

E.B Hogenauer, "An economical class of digital filters for decimation and interpolation," IEEE Trans. Acoust. Speech, Signal Processing, vol. ASSP-29, pp. 155-162, Apr. 1981.
T. Hentschel, "Sample Rate Conversion in Software Configurable Radios," pp. 197-204, Artech House, 2002, Norwood, MA. (month unknown).

* cited by examiner

*Primary Examiner*—Jean Bruner Jeanglaude
(74) *Attorney, Agent, or Firm*—Davis Chin; Steven Lin; Gregory S. Thomas

(57) ABSTRACT

A non-integer CIC interpolation filter is provided for use in sigma-delta digital-to-analog systems, which realizes non-integer interpolation but eliminates the need for coupling of the integrators in the output domain. The present non-integer interpolation filter provides for more attenuation to all of the aliases of the input signal and has eliminated the need of complex computations.

12 Claims, 5 Drawing Sheets

NON-INTEGER INTERPOLATION USING CASCADED INTEGRATOR-COMB FILTER

CROSS-REFERENCE TO RELATED CO-PENDING APPLICATIONS

Related, co-pending applications of particular interest are U.S. application Ser. No. 11/317,546, filed Dec. 23, 2005, on behalf of Lei Ding, John L. Melanson, Xiaofan Fei and Johann Gaboriau and entitled "Non-Integer Decimation Using Cascaded Integrator-Comb Filter," and U.S. application Ser. No. 11/478,275, filed Jun. 29, 2006, on behalf of Lei Ding, John L. Melanson, Xiaofan Fei and Bruce Duewer and entitled "Digital Non-Integer Sample/Hold Implemented Using Virtual Filtering," both assigned to the same assignee as the present invention, whose descriptions are hereby incorporated in their entirety by reference.

BACKGROUND OF THE INVENTION

1. Field of the Invention

This invention relates generally to interpolation filters and more particularly, it relates to an improved non-integer CIC interpolation filter for use in sigma-delta digital-to-analog systems, which realizes non-integer interpolation but eliminates the need for coupling of the integrators in the output domain.

2. Description of the Prior Art

Over the past decade or more, the use of digital technology in the portable audio industry has become very widespread. In the case of a system where a universal serial bus (USB) is used, the popular choice of the master clock frequency is 12 MHz since it can be used to generate many audio sample rates by integer divisions. For example, the audio sampling rate of 48 kHz can be easily obtained by dividing the 12 MHz master clock frequency by 250 or the sampling rate of 44.1 kHz can be obtained by dividing the 12 MHz frequency by 272 (which is not exact, but has a 0.04% deviation).

However, the variable ratios between the master clock frequency and the audio sampling rate frequently require interpolation filters to support multiple interpolation ratios, which may not be an integer as in the case of normal systems using a standard 12.288 MHz audio master clock frequency. For instance, in the normal system where the modulator of a sigma-delta digital-to-analog converter (DAC) system is assumed to operate at one-half of a master clock having a frequency of 12.288 MHz so as to lower power consumption without sacrificing performance, the input sample rate of 96 kHz is easily converted or upsampled by 64 in order to obtain the 6.144 MHz sample rate at the modulator. On the other hand, in the case of the USB system the master clock has a frequency of 12 MHz. Therefore, the input sample rate of 96 kHz cannot be easily converted or upsampled to 6 MHz since this requires multiplying by a non-integer ratio of 125/2 or 62.5.

For discussion purposes, as is illustrated in FIG. 1, the front-end portion of a conventional sigma-delta digital-to-analog converter system 10 includes an interpolation filter 12 that increases the sampling rate of a digital input signal (i.e., a low-rate 24-bit input signal) by a predetermined upsampling ratio (i.e., 4) to a high sampling rate and that has a good anti-aliasing performance so as to reject images that occur at approximately the Nyquist rate of the input signal. The higher rate digital signal is then transmitted to a sample/hold block 14 having an output that is fed to a high-rate sigma-delta modulator 16 which shapes quantization noise out of the input signal band and reduces the sample to a 4-bit output signal.

In this particular configuration, the interpolation filter 12 effectively pushes aliases of the input signal to around $4\text{-}f_s$ and beyond so that a substantial amount of the noise power is translated to frequency bands well above the signal band of interest. The sample/hold block 14 is used to upsample the output of the interpolation filter to the rate at which the modulator operates and provides additional attenuation to the aliases. The amounts of attenuation required on the aliases at around and above $4\text{-}f_s$ are relatively low due to the high pass filtering of the quantization noise in the sigma-delta modulator 16.

As can be seen from FIG. 1, in the normal system where the 12.288 MHz master clock frequency is available, the sample/hold block 14 outputs each input sample 32 times. However, in the USB system with an input sample rate of 48 kHz for a 12 MHz master clock frequency and after the upsample of 4 by the interpolation filter 12, there is required a non-integer sample/hold ratio of 125/4 or 31.25 in order to obtain a 6 MHz sampling rate at the modulator. This non-integer sample/hold ratio creates undesirable tones which are very close to the signal band of interest.

Cascaded integrator-comb (CIC) filter arrangements are widely used in multi-rate signal processing systems for interpolation in which the ratios are integers. However, there are presented problems with requirements of high rate intermediate clock at the upsampled sample domain with the traditional CIC filter arrangements when the ratios are non-integers.

CIC filters consisting of a cascade of ideal integrator stages operating at a high sampling rate and an equal number of comb stages operating at a low sampling rate are discussed in E. B. Hogenauer, "An economical class of digital filters for decimation and interpolation," *IEEE Trans. Acoust. Speech, Signal Processing*, vol. ASSP-29, pp. 155-162, April 1981.

Time-varying CIC filters for fractional sample-rate conversion (SRC) are discussed in a text book authored by T. Hentschel, "Sample Rate Conversion in Software Configurable Radios," pages 197-204, Norwood, Mass.: Artech House, 2002. The structure for such a time-variant CIC filter in Hentschel is depicted in FIG. 2 and has been labeled "Prior Art". This approach utilizes a conventional CIC filter in the upsampled domain and then derives an equivalent structure in the output domain. As a result, each and every one of the integrators operating at the output sampling rate $F_{out}$ requires corrections from all of the integrators preceding it. Thus, this implementation in FIG. 2 is quite complicated.

Accordingly, it would be desirable to provide an improved non-integer CIC interpolation filter, which eliminates the need for coupling the integrators in the output domain. It would also be expedient that the CIC interpolation filter provides more attenuation to all of the aliases of the input signal.

SUMMARY OF THE INVENTION

Accordingly, it is a general object of the present invention to provide an improved non-integer CIC interpolation filter which overcomes all of the disadvantages of the prior art.

It is an object to provide an improved non-integer CIC interpolation filter which realizes non-integer interpolation but eliminates the need for coupling of the integrators in the output domain.

It is another object of the present invention to provide an improved non-integer CIC interpolation filter which is of a simpler design and can be implemented with relatively low computational complexity.

It is still another object of the present invention to provide an improved non-integer CIC interpolation filter which includes integrators that operate at the output sampling rate.

In a preferred embodiment of the present invention, there is provided a non-integer interpolation filter for interpolating an input value which includes an N-th order differentiator for differentiating the input value in an input sample domain at an input sample rate and for generating a difference of the input value at the output of the N-th order differentiator. A multiplier network is formed of multiplier stages and is coupled to the output of the N-th order differentiator for combining the output of the N-th order differentiator with corresponding coefficients and for generating output values in the input sample domain.

An N-th order integrator is formed of integrator stages. Each of the integrator stages is associated to only a corresponding single coefficient of the corresponding coefficients through only a respective one of the multiplier stages for integrating the same and for generating an interpolated output value at an output sample rate in which the output sample rate has a non-integer factor with respect to the input sample rate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1(*a*) is a block diagram of a front-end portion of a sigma-delta digital-to-analog converter system, constructed in accordance with the principles of the present invention;

DESCRIPTION OF THE PREFERRED EMBODIMENTS

Figure 1:
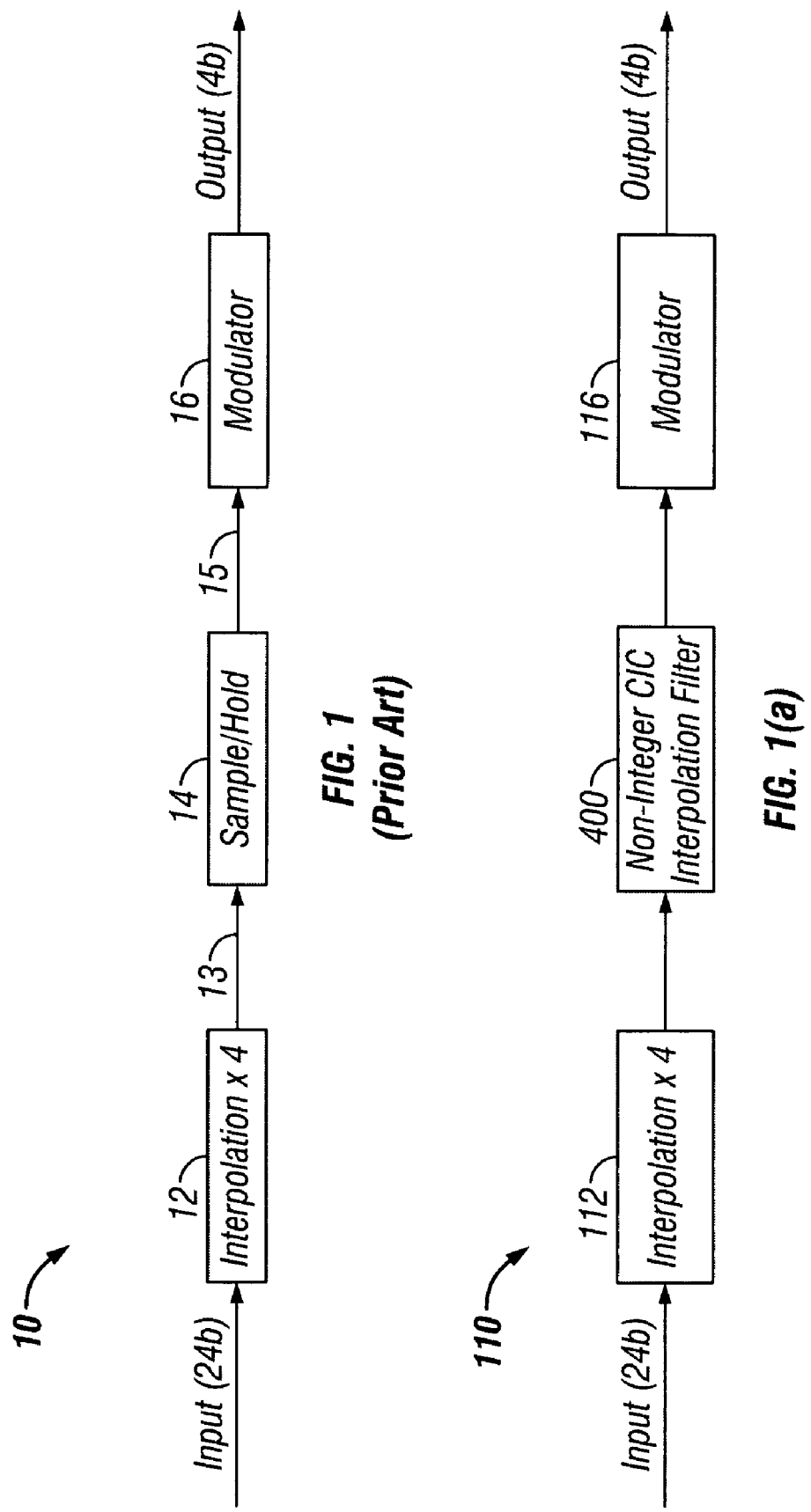
FIG. 1 is a block diagram of a front-end portion of a conventional sigma-delta digital-to-analog converter system, which has been labeled "Prior Art"

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Figure 3:
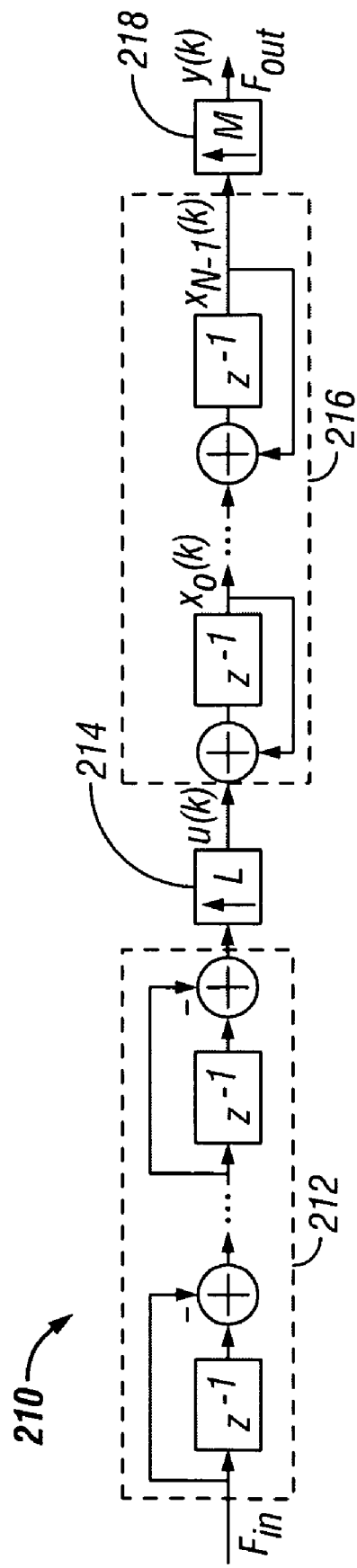
FIG. 3 is a block diagram of a conventional N-th order CIC filter arrangement.

As a background and in order to assist in the understanding of the present invention, it is believed that it would be helpful to discuss initially the conventional N-th order cascaded integrator-comb (CIC) filter arrangement 210 for performing non-integer interpolation in FIG. 3 prior to the detailed explanation of the present invention.

As can be seen, the non-integer interpolation CIC filter arrangement 210 comprises an input-end differentiator section 212 of the N-th order, an interpolator stage 214 having the integer factor L, an output-end integrator section 216 of the N-th order, and a decimator stage 218 having the integer factor M. The comb section or differentiator section 212 of the filter arrangement operates at the input sample rate Fin and the output thereof has been upsampled and fed into the integrator section 216 operating at the upsampled rate $LF_{in}$. The output from the last integrator in the integrator section is then decimated by the integer factor M so as to generate the final output sample rate $F_{out}$.

This implementation of FIG. 3 suffers from the drawback in that many of the output samples from the integrators are calculated but are never actually used because of the subsequent decimation in the decimator stage 218. In addition, the high upsampled rate at $LF_{in}$ may not be available in real systems. A more efficient approach would be to update the integrators at the output sample rate $F_{out}$. Therefore, each and every update of the integrators would generate a useful output. This also means that the integrators are changed every M samples in the upsampled domain instead of being changed for every sample as shown in FIG. 3.

Figure 2:
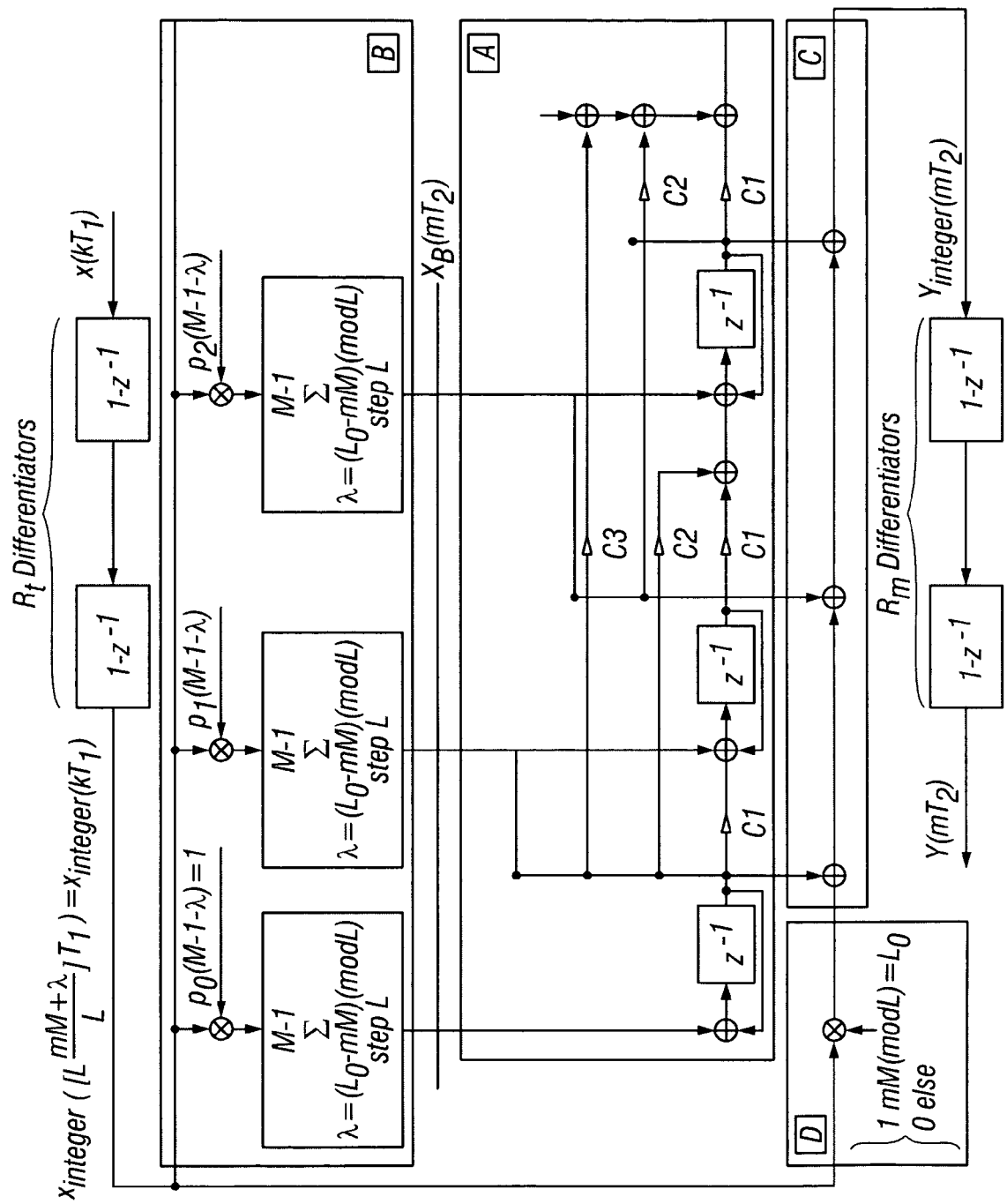
FIG. 2 is a block diagram of a conventional time-varying CIC filter, which has been labeled "Prior Art"

In normal operations, the integrator section 216 of this filter arrangement 210 can be represented by N state variables in state-space form by a set of normal equations written in a matrix form as follows:

$$x(k+1)=Ax(k)+bu(k)$$
$$y(k)=cx(k)+du(k) \quad (1)$$

where x(k) is the length N state vector formed as $[x_0(k), \ldots, x_{N-1}(k)]^T$, y(k) is the output of the integrator section 216, and u(k) is the input of the integrator section 216. In equations (1) above, A is the state transition matrix, b and c are column vectors, and d is a scalar quantity. For the integrators in the integrator section 216 as shown in FIG. 2, the model coefficients are given as follows:

$$a = \begin{bmatrix} 1 & 0 & 0 & \cdots & 0 \\ 1 & 1 & 0 & \ddots & \vdots \\ 0 & 1 & 1 & \ddots & 0 \\ \vdots & \ddots & \ddots & \ddots & 0 \\ 0 & \cdots & 0 & 1 & 1 \end{bmatrix} \quad (2)$$

$$b = [1 \quad 0 \quad \cdots \quad 0]^T$$
$$c = [0 \quad 0 \quad \cdots \quad 1]$$
$$d = 0$$

Since the integrators are being updated at the output sample rate $F_{out}$, it is initially needed to derive the state-space equations after M updates in the upsampled domain. If it is assumed that after such upsampling, the integrator is represented by the matrix A and the column vector b, then the update equations x(k+1) to x(k+M) are given by:

$$\begin{aligned} x(k+1) &= Ax(k) + bu(k) \\ x(k+2) &= Ax(k+1) + bu(k) \\ &\vdots \quad \vdots \quad \vdots \\ x(k+M) &= Ax(k+M-1) + bu(k+M-1) \end{aligned} \quad (3)$$

By substituting each branch of the update equations sequentially in equation (3) above into the next higher branch, there is obtained the following state variable update equation at the output sampling rate, expressed in the following equation that links x(k+M) with x(k):

$$x(k+M) = A^M x(k) + \left[ \sum_{m=0}^{M-1} A^m bu(k+m) \right] \quad (4)$$

In equation (4), it can be seen that updating the integrators at $F_{out}$ will change the state transition matrix from A to $A^M$ and requires that each integrator receive a modified version of u(k). The final output at $F_{out}$ is given by:

$$y(k+M)=cx(k+M)+du(k+M) \quad (5)$$

For purposes of illustration and discussion, the underlying principles for an N-th order time-varying CIC filter will now be described. If the state transition matrix A in equation (2) above is used in the upsampled domain, the resulting matrix $A^M$ in the output domain will be a lower triangular matrix with non-zero entries. As previously pointed out, each integrator operating at the output sampling rate $F_{out}$ will require inputs from all of the preceding integrators, thereby rendering high computational complexity. In order to obtain a simpler structure at the output sampling rate $F_{out}$, the inventors have chosen to make the matrix $A^M$ in the output domain to have the following form:

$$A^M = \begin{bmatrix} 1 & 0 & 0 & \cdots & 0 \\ 1 & 1 & 0 & \ddots & \vdots \\ 0 & 1 & 1 & \ddots & 0 \\ \vdots & \ddots & \ddots & \ddots & 0 \\ 0 & \cdots & 0 & 1 & 1 \end{bmatrix} \quad (6)$$

This form is the same integrator structure as shown in equation (2) above for the matrix A. By selecting the form in equation (6), there has been eliminated the coupling in the integrators operating at $F_{out}$. The significance of this is that in the upsampled domain the original matrix A can be viewed as the M-th root of the matrix $A^M$ and can be expressed as follows:

$$A = \begin{bmatrix} 1 & 0 & 0 & \cdots & 0 \\ a_1 & 1 & 0 & \ddots & \vdots \\ a_2 & a_1 & 1 & \ddots & 0 \\ \vdots & \ddots & \ddots & \ddots & 0 \\ a_{N-1} & \cdots & a_2 & a_1 & 1 \end{bmatrix} \quad (7)$$

with $$a_k = \frac{\prod_{i=1}^{k} [1-(i-1)M]}{k! M^k} \quad (8)$$

By raising the matrix A to the m-th power, there is given:

$$A^m = \begin{bmatrix} 1 & 0 & 0 & \cdots & 0 \\ a_{1,m} & 1 & 0 & \ddots & \vdots \\ a_{2,m} & a_{1,m} & 1 & \ddots & 0 \\ \vdots & \ddots & \ddots & \ddots & 0 \\ a_{N-1,m} & \cdots & a_{2,m} & a_{1,m} & 1 \end{bmatrix} \quad (9)$$

with $$a_{k,m} = \frac{\prod_{i=1}^{k} [m-(i-1)M]}{k! M^k} \quad (10)$$

If it is assumed that upsampling by L is performed by inserting zeros, then the input to the integrators in the integrator section 216 is only non-zero for only one sample for every L samples in the upsampled domain. When the factor L is greater than M (L>M) for the application of interpolation, it can be seen that, at most, one term is required to be calculated per output in the summation sign in equation (4) above.

With reference now in detail to the drawings, there is shown in FIG. 1(a) a front-end portion of sigma-delta digital-to-analog converter system 110, constructed in accordance with the principles of the present invention and utilizing a unique non-integer CIC interpolation filter for implementing non-integer sample/hold operations. Specifically, the converter system 110 comprises an interpolation filter 112, a non-integer CIC interpolation filter 400, and a sigma-delta modulator 116. The non-integer CIC interpolation filter 400 increases the sampling rate of a digital input signal (i.e., a low-rate 24-bit input signal) by a predetermined upsampling ratio (i.e., 4) to a high sampling rate and provides a good anti-aliasing performance so as to reject images that occur at approximately the Nyquist rate of the input signal. The higher rate digital signal is then transmitted to the CIC interpolation filter 400 having an output that is fed to the high-rate sigma-delta modulator 116 which shapes quantization noise out of the input signal band and reduces the sample to a 4-bit output signal.

Figure 4:
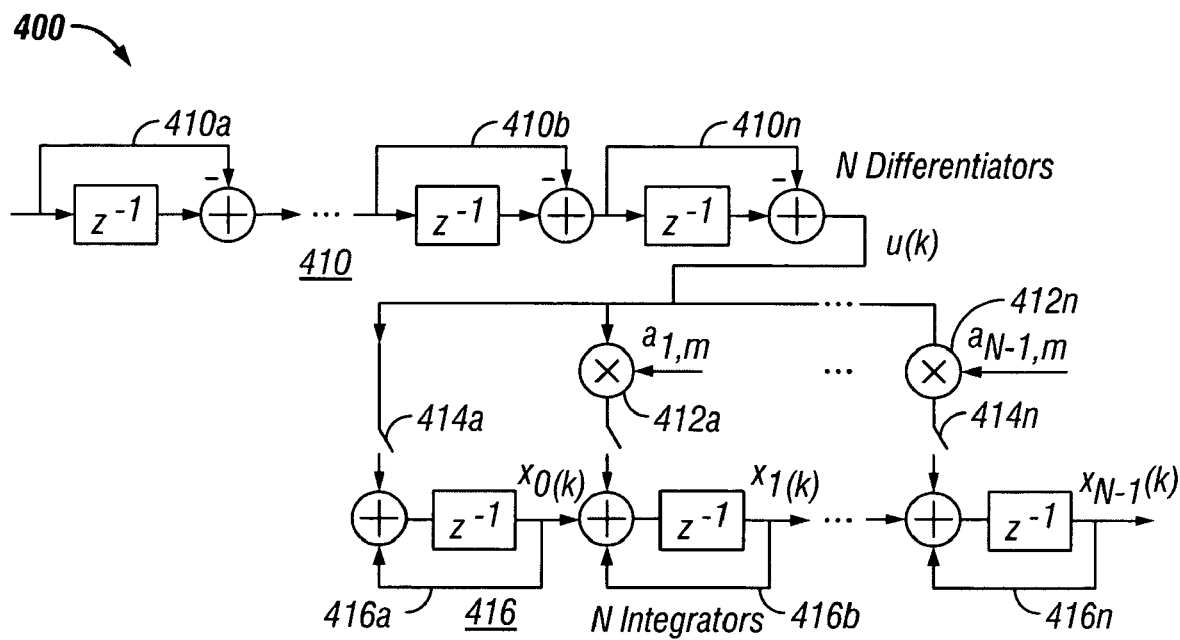
FIG. 4 is a block diagram of an improved non-integer CIC interpolation filter 400, constructed in accordance with the principles of the present invention.

In FIG. 4, there is depicted a simplified block diagram of the improved non-integer cascaded integrator-comb (CIC) interpolation filter 400 of FIG. 1(a), constructed in accordance with the present invention. The interpolation filter 400 comprises a differentiator section 410 of the N-th order, multipliers 412a-412n, switch devices 414a-414n, and an integrator section 416 of N-th order. The differentiator section 410 includes differentiator stages 410a, 410b . . . 410n, where the last stage 410n generates input u(k) defining state variables which are applied to the respective switch devices 414a through 414n via the multipliers 412a-412n. The multipliers multiply the state variables with the corresponding coefficients and are then sent to the respective integrator stages 416a-416n of the integrator section. The last integrator stage 416n generates the final interpolated output y(k).

By comparing with the prior art implementation of FIG. 2, it can be seen that this structure of the present invention is much more simple and efficient. The differentiator section 410 of the interpolation filter 400 and the multipliers 412a-412n are operated at the input sampling rate Fin, and the integrator section 416 is operated at the output sampling rate $F_{out}$. The coefficients $a_{i,m}$-$a_{N-1,m}$ for the multipliers 412a-412n are defined by equation (10) above, and the index m is given by [l*L (mod M)] with l=0, 1, 2 . . . .

In addition, unlike the prior art of FIG. 2, each of the integrator stages 416a-416n of the integrator section 416 is associated to only a corresponding single coefficient of the corresponding coefficients $a_{i,m}$-$a_{N-1,m}$ through only a respective one of the multipliers 412a-412n. As a result, each of the integrator stages of the present invention is not required to be cross-coupled so as to receive correction coefficients from all of the preceding integrators.

In FIG. 4, the first integrator stage 416a can actually be removed since the combination of the last differentiator stage 410n and the first integrator 416a performs simply a sample-and-hold operation. However, the last differentiator stage 410n cannot be removed because it is still required for generating inputs for the remainder of the integrator stages 416b-416n.

Figure 5:
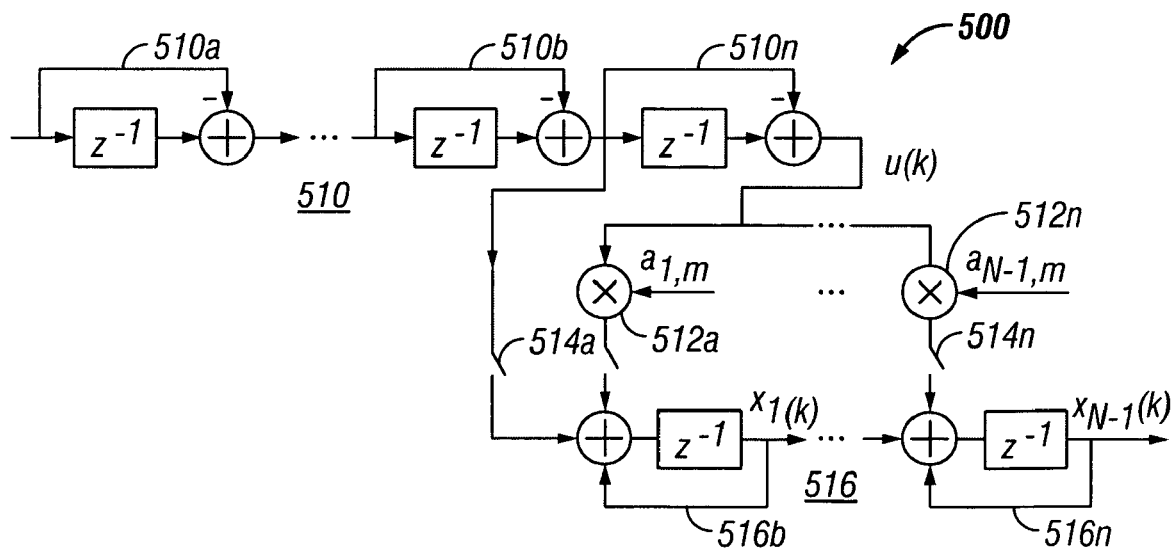
FIG. 5 is a block diagram of a simplified version of the non-integer CIC interpolation filter of FIG. 4.

In FIG. 5, there is shown a block diagram of a CIC interpolation filter 500 which is the simplified version of FIG. 4 with the integrator stage 416a being eliminated. In particular, the interpolation filter 500 comprises a differentiator section 510 of the N-th order, multipliers 512a-512n, switch devices 514a-514n, and an integrator section 516 of N-th order. The differentiator section 510 includes differentiator stages 510a, 510b . . . 510n, where the last stage 510n generates input u(k) defining state variables which are applied to the respective switch devices 514a through 514n via the multipliers 512a-512n. The multipliers multiply the state variables with the corresponding coefficients and are then sent to the respective integrator stages 516b-516n of the integrator section. The last integrator stage 516n generates the final interpolated output y(k). The input to the switch 514a is now connected to the output of the next to last differentiator stage $510_{(n-1)}$ rather than the last one as in FIG. 4.

Unlike the embodiment of FIG. 4 in which the number of integrator stages is equal to the number of differentiators for the N-th order CIC interpolation filter 400 (i.e., where N is an integer greater than 1), the number of integrator stages in the N-th order CIC filter 500 of FIG. 5 is to equal N−1 and the number of differentiators is equal to N. As previously pointed out, the reason why it is possible to eliminate the first integrator stage 416a of FIG. 4 is because the combination of the last differentiator stage 410n and the first integrator stage 416a is used only to perform a simple sample-and-hold operation.

For the purposes of illustration, a second order time-varying CIC filter for realizing an interpolation ratio of 31.25 (where the interpolation factor L=125 and the decimation factor M=4) will now be explained in detail. Therefore, by using equation (8) above, the state transition matrix in equation (7) can be simplified and is given by:

$$A = \begin{bmatrix} 1 & 0 \\ \frac{1}{4} & 1 \end{bmatrix} \quad (11)$$

By using the respective equations (4) and (5) above, the update equations for the integrators and the final output $F_{out}$ can be expressed as follows:

$$\begin{bmatrix} x_0(k+M) \\ x_1(k+M) \end{bmatrix} = \begin{bmatrix} 1 & 0 \\ 1 & 1 \end{bmatrix} \begin{bmatrix} x_0(k) \\ x_1(k) \end{bmatrix} + \sum_{m=0}^{M-1} \begin{bmatrix} 1 \\ \frac{m}{4} \end{bmatrix} u(k+m) \quad (12)$$

and $$y(k+M) = x_1(k+M) \quad (13)$$

The input signal on line 13 to the sample/hold block 14 in FIG. 1 is assumed to be a 20 kHz sine wave sampled at the rate of 192 kHz (i.e., an original input sampling rate $F_s$ of 48 kHz which has been upsampled by 4 with the interpolator 12). If no filter is used in the upsample domain, then a simple way of achieving the upsampling ratio of 31.25 at the output on line 15 from the sample/hold block 14 is to merely hold the first, second, third and fourth input samples 31, 30, 30, and 30 times, respectively, and then repeating this process over and over. Thus, the average of the number of times in which the four input samples are being held should be equal to 125/4 or 31.25. For this case, the amplitude/frequency spectrum of the output from the sample/hold block 14 without any filtering is illustrated in FIG. 6.

Figure 6:
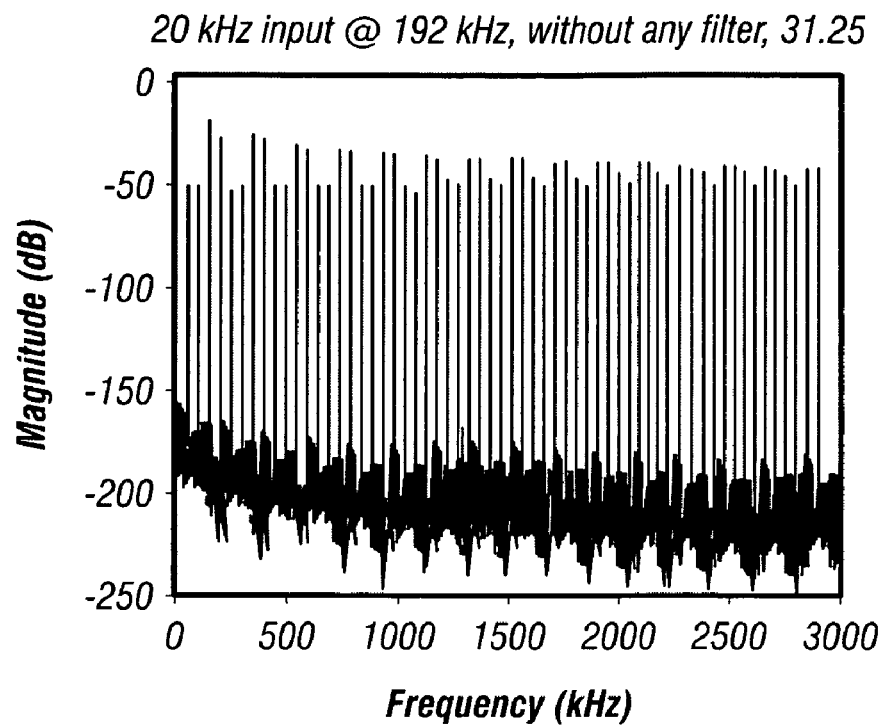
FIG. 6 is a plot of the amplitude/frequency spectrum of the output of the sample/hold block 14 of FIG. 1 without any filter.
Figure 7:
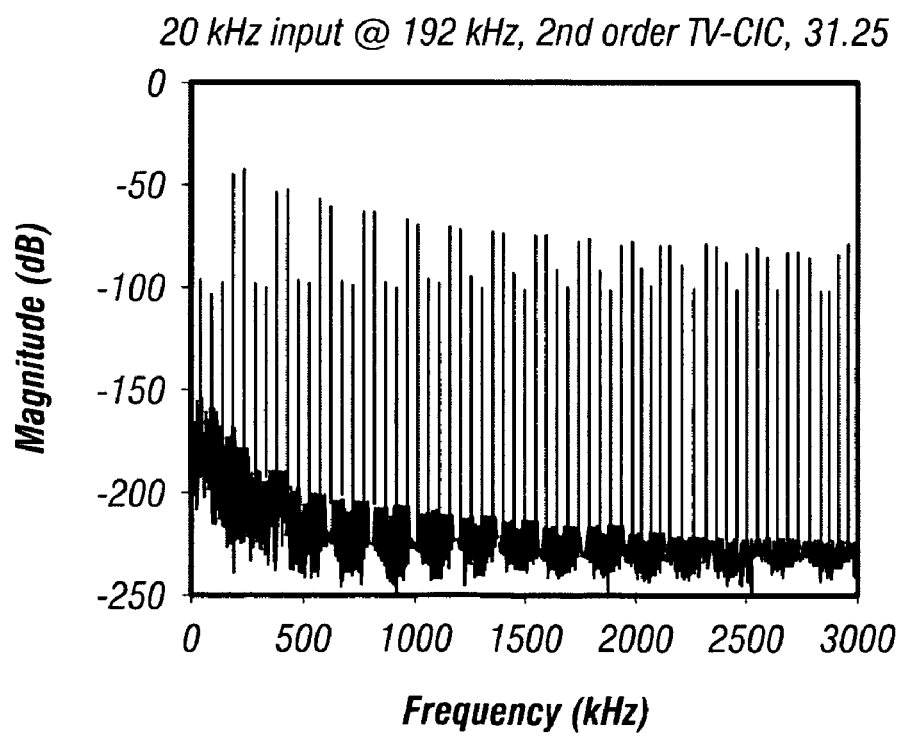
FIG. 7 is a plot of the amplitude/frequency spectrum of the output of the filter block 400 of FIG. 1(*a*) with a second order time-variant CIC filter of FIG. 4.

It can be seen that since no filter is used when the interpolation is performed, aliases of the input signal will fold-back into the signal band (e.g., 0-48 kHz) at around −50 dB level in FIG. 6. This attenuation to the aliases is introduced by zero-order sample/hold operation. In FIG. 7, there is shown the amplitude-frequency spectrum of the output from the filter block 400 with the second order time-varying CIC filter of the present invention. The attenuation of the aliases after interpolation has been increased by the CIC filter in the upsampled domain. In particular, the aliases of the input signal folding back in the signal band is at around −100 dB. Further, the alias at the frequency of 192 kHz is down around −40 dB as compared to −20 dB in FIG. 6.

The non-integer CIC interpolation filter of the present invention has the following advantages over the prior art as follows:

(1) It has low complexity state variable update equations in the output sample domain;

(2) It has a low computational rate; and (3) It provides good attenuation to aliases of the input signal.

From the foregoing detailed description, it can thus be seen that the present invention provides an improved non-integer CIC interpolation filter for use in sigma-delta digital-to-analog systems, which realizes non-integer interpolation but eliminates the need for coupling of the integrators in the output domain. The present non-integer interpolation filter provides for more attenuation to all of the aliases of the input signal.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. A non-integer interpolation filter for interpolating an input value, comprising:
    an N-th order differentiator for differentiating the input value in an input sample domain at an input sample rate and for generating a difference of the input value at the output of said N-th order differentiator;
    a multiplier network formed of multiplier stages and being coupled to the output of said N-th order differentiator for combining the output of said N-th order differentiator with corresponding coefficients and for generating output values in the input sample domain;
    an N-th order integrator formed of integrator stages in which each of said integrator stages is associated to only a corresponding single coefficient of said corresponding coefficients through only a respective one of said multiplier stages for integrating the same and for generating an interpolated output value at an output sample rate in which the output sample rate has a non-integer factor with respect to the input sample rate; and
    said N-th order being greater than a first order.

2. A non-integer interpolation filter as claimed in claim 1, wherein the non-integer factor is defined by an interpolation ratio L/M, where L is an interpolation factor of a positive integer and M is a decimation factor of a positive integer.

3. A non-integer interpolation filter as claimed in claim 1, wherein each multiplier stage of said multiplier network includes a multiplier device for multiplying the output of said N-th order differentiator with said corresponding coefficients in the input sample domain.

4. A non-integer interpolation filter as claimed in claim 1, wherein said N-th order differentiator includes N number of differentiator stages and said N-th order integrator includes N number of integrator stages, said number N being an integer greater than 1.

5. A non-integer interpolation filter as claimed in claim 1, wherein said N-th order differentiator includes N number of differentiator stages and said N-th order integrator includes N−1 number of integrator stages, said number N being an integer greater than 1.

6. A non-integer interpolation filter for interpolating an input value, comprising:
    an N-th order differentiator network for differentiating the input value in an input sample domain at an input sample rate and for generating a difference of the input value at the output of said N-th order differentiator network;
    said N-th order differentiator network being formed of a plurality of differentiator stages being of an integer number N;
    a multiplier network coupled to the output of said N-th order differentiator network for combining the output of said N-th order differentiator network with corresponding coefficients and for generating output values in the input sample domain;
    an N-th order integrator network for integrating the combination of the output of said N-th order differentiator network and the output values from said multiplier network and for generating an interpolated output value at an output sample rate in which the output sample rate has a non-integer factor with respect to the input sample rate; and
    said N-th order integrator network being formed of a plurality of integrator stages being of an integer number N−1, said integer number N being greater than 1 and said N-th order being greater than a first order.

7. A non-integer interpolation filter as claimed in claim 6, wherein the non-integer factor is defined by an interpolation ratio L/M, where L is an interpolation factor of a positive integer and M is a decimation factor of a positive integer.

8. A non-integer interpolation filter as claimed in claim 6, wherein said multiplier network includes a plurality of multiplier devices for multiplying the output of said N-th order differentiator with said corresponding coefficients in the input sample domain.

9. A non-integer interpolation filter as claimed in claim 6, wherein said multiplier network includes multiplier stages and wherein each of said plurality of integrator stages is associated to only a corresponding single coefficient of said corresponding coefficients through only a respective one of said multiplier stages.

10. A method for interpolating an input value, comprising:
    differentiating at a first differentiator the input value in an input domain at an input sample rate to generate a first difference of the input value at the output of said first differentiator;
    also differentiating at a second differentiator the first difference of the input value in the input domain at the input sample rate to generate a second difference at the output of said differentiator;
    coupling the output of the second differentiator with corresponding coefficients of multiplier stages to generate output values in an output sample domain;
    receiving the output from the second differentiator at the first integrator;
    receiving the output from the first integrator and the output values from the multiplier network at the second integrator to generate an interpolated output value at an output sample rate in which the output sample rate has a non-integer factor with respect to the input sample rate; and
    associating each of said first and second integrators to only a corresponding single coefficient of said corresponding coefficients through only a respective one of said multiplier stages.

11. A method for interpolating an input value as claimed in claim 10, further defining the non-integer factor by an interpolation ratio L/M, where L is an interpolation factor of a positive integer and M is a decimation factor of a positive integer.

12. A method for interpolating an input value as claimed in claim 10, wherein the coupling step includes multiplying with a multiplier device in the multiplier stages the output of said N-th order differentiator with said corresponding coefficients in the input sample domain.

* * * * *

UNITED STATES PATENT AND TRADEMARK OFFICE
CERTIFICATE OF CORRECTION

| | | |
|---|---|---|
| PATENT NO. | : 7,324,025 B1 | Page 1 of 1 |
| APPLICATION NO. | : 11/528805 | |
| DATED | : January 29, 2008 | |
| INVENTOR(S) | : Lei Ding, John L. Melanson and Xiaofan Fei | |

It is certified that error appears in the above-identified patent and that said Letters Patent is hereby corrected as shown below:

Column 4, line 7, change "Fin" to -- $F_{in}$ --.

Column 4, line 40, in equation (2) change "a" to -- A --.

Column 6, line 67, change "Fin" to -- $F_{in}$ --.

Signed and Sealed this

Twenty-seventh Day of May, 2008

JON W. DUDAS
*Director of the United States Patent and Trademark Office*